United States Patent
Lee et al.

(10) Patent No.: US 7,138,309 B2
(45) Date of Patent: Nov. 21, 2006

(54) INTEGRATION OF BIAXIAL TENSILE STRAINED NMOS AND UNIAXIAL COMPRESSIVE STRAINED PMOS ON THE SAME WAFER

(75) Inventors: Jong-Jan Lee, Camas, WA (US);
Jer-Shen Maa, Vancouver, WA (US);
Douglas J. Tweet, Camas, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 184 days.

(21) Appl. No.: 11/039,542

(22) Filed: Jan. 19, 2005

(65) Prior Publication Data

US 2006/0160291 A1 Jul. 20, 2006

(51) Int. Cl.
*H01L 21/8234* (2006.01)
*H01L 21/8238* (2006.01)

(52) U.S. Cl. ............... 438/197; 438/199; 257/E21.129

(58) Field of Classification Search ............... 438/197, 438/199, 233, 231, 758, 300, 296; 257/E21.129, 257/E21.431
See application file for complete search history.

(56) References Cited

U.S. PATENT DOCUMENTS

| | | | |
|---|---|---|---|
| 6,767,802 B1 | 7/2004 | Maa et al. | |
| 6,780,796 B1 | 8/2004 | Maa et al. | |
| 2005/0035470 A1* | 2/2005 | Ko et al. | 257/900 |
| 2005/0285187 A1* | 12/2005 | Bryant et al. | 257/335 |

OTHER PUBLICATIONS

U.S. Appl. No. 10/674,369, filed Sep. 29, 2003, Maa et al.
U.S. Appl. No. 10/755,615, filed Jan. 12, 2004, Maa et al.
Rim et al., *Characteristics and Device Designs of Sub-100 nm Strained-Si N- and PMOSFETs*, VLSI Symp. Tech. Dig., pp. 98-99 (2002).
Thompson et al., *A Logic Nanotechnology Featuring Strained Silicon*, IEEE Electron Device Letter, vol. 25, No. 4, pp. 191-193 (2004).
Lee et al., *Fabrication of Strained Silicon on Insulator (SSOI) by Direct Wafer Bonding Using Thin Relaxed SiGe Film as Virtual Substrate*, MRS Proceedings vol. 809, (2004).

* cited by examiner

*Primary Examiner*—Walter Lindsay, Jr.
(74) *Attorney, Agent, or Firm*—David C. Ripma (57) ABSTRACT

A method of fabricating a biaxial tensile strained layer for NMOS fabrication and a uniaxial compressive strained layer for PMOS fabrication on a single wafer for use in CMOS ICs, includes preparing a silicon substrate for CMOS fabrication; depositing, patterning and etching a first and second insulating layers; removing a portion of the second insulating layer from a PMOS active area; depositing a layer of epitaxial silicon on the PMOS active area; removing a portion of the second insulating layer from an NMOS active area; growing an epitaxial silicon layer and growing an epitaxial SiGe layer on the NMOS active area; implanting $H_2^+$ ions; annealing the wafer to relax the SiGe layer; removing the remaining second insulating layer from the wafer; growing a layer of silicon; finishing a gate module; depositing a layer of $SiO_2$ to cover the NMOS wafer; etching silicon in the PMOS active area; selectively growing a SiGe layer on the PMOS active area; wherein the silicon layer in the NMOS active area is under biaxial tensile strain, and the silicon layer in the PMOS active area is uniaxial compressive strained; and completing the CMOS device.

12 Claims, 9 Drawing Sheets

INTEGRATION OF BIAXIAL TENSILE STRAINED NMOS AND UNIAXIAL COMPRESSIVE STRAINED PMOS ON THE SAME WAFER

FIELD OF THE INVENTION

This invention relates to high density, low power ICs, and specifically to fabrication of a biaxial tensile strained NMOS and a uniaxial compressive strained PMOS on a single wafer for use in CMOS ICs.

BACKGROUND OF THE INVENTION

Carrier transport enhancement through the use of a strained-silicon channel results in CMOS technology having improved speed and using less power than conventionally fabricated CMOS devices. Data provided by Rim et al., *Characteristics and Device Designs of Sub-100 nm Strained-Si N- and PMOSFETs*, VLSI Symp. Tech. Dig., pp 98–99 (2002), was measured from a PMOS structure fabricated on biaxial tensile strained silicon. Data from Thompson et al., *A Logic Nanotechnology Featuring Strained Silicon*, IEEE Electron Device Letter, Vol. 25, No. 4, pp. 191–193 (2004), was measured from uniaxial compressive strained PMOS.

In order to improve the hole mobility at the operating voltage, Thompson et al., supra, reported using uniaxial compressive strain on the PMOS channel along the channel direction. Unlike the hole mobility, as report4ed by Rim et al., supra, which is dependent on the operating voltage of the biaxial tensile strained PMOS, the hole mobility data gathered by Thompson et al. indicates that the hole mobility improvement is independent of the operating voltage for a uniaxial compressive strained PMOS. To achieve uniaxial compressive strain in PMOS, silicon was etched on the source/drain areas and then SiGe was selectively grown on the source/drain area. For the NMOS, high stress $Si_3N_4$ film was deposited after the gate module completion and the NMOS channel was placed under uniaxial tensile strain. The mobility improvement detected in the NMOS in this case was not as much as in the biaxial strained NMOS case. In the case of a biaxial tensile strained NMOS, the electron mobility improvement is about 80% to 100%, and has little dependence on the vertical electrical field.

We have described direct wafer bonding in publications and co-pending patent applications: Lee et al., *Fabrication of Strained Silicon on Insulator (SSOI) by Direct Wafer Bonding Using Thin Relaxed SiGe Film as Virtual Substrate*, MRS Proceedings Vol. 809, (2004); Maa et al., *Method of making relaxed silicon-germanium on glass via layer transfer*, U.S. patent application Ser. No. 10/674,369, filed Sep. 29, 2003; Maa et al., *Strained silicon on insulator from film transfer and relaxation by hydrogen implantation*, U.S. patent application Ser. No. 10/755,615, filed Jan. 12, 2004; Maa et al., *Method of Forming Relaxed SiGe Layer*, U.S. Pat. No. 6,780,796 B2, granted Aug. 24, 2004; and Maa et al., *Method of Making Relaxed Silicon-Germanium on Insulator via Layer Transfer*, U.S. Pat. No. 6,767,802 B1, granted Jul. 27, 2004.

SUMMARY OF THE INVENTION

A method of fabricating a biaxial tensile strained layer for NMOS fabrication and a uniaxial compressive strained layer for PMOS fabrication on a single wafer for use in CMOS ICs, includes preparing a silicon substrate for CMOS fabrication; depositing, patterning and etching a first and second insulating layers; removing a portion of the second insulating layer from a PMOS active area; depositing a layer of epitaxial silicon on the PMOS active area; removing a portion of the second insulating layer from an NMOS active area; growing an epitaxial silicon layer and growing an epitaxial SiGe layer on the NMOS active area; implanting $H_2^+$ ions; annealing the wafer to relax the SiGe layer; removing the remaining second insulating layer from the wafer; growing a layer of silicon; finishing a gate module; depositing a layer of $SiO_2$ to cover the NMOS wafer; etching silicon in the PMOS active area; selectively growing a SiGe layer on the PMOS active area; wherein the silicon layer in the NMOS active area is under biaxial tensile strain, and the silicon layer in the PMOS active area is uniaxial compressive strained; and completing the CMOS device.

It is an object of the invention to provide a method of fabricating a biaxial tensile strained silicon film for NMOS fabrication and uniaxial compressive strained silicon channel for PMOS fabrication on a single wafer.

Another object of the invention is to provide a method of using biaxial tensile strained silicon film for NMOS fabrication and uniaxial compressive strained silicon channel for PMOS fabrication.

Another object of the invention is to provide a method of fabricating such devices on SOI wafers.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
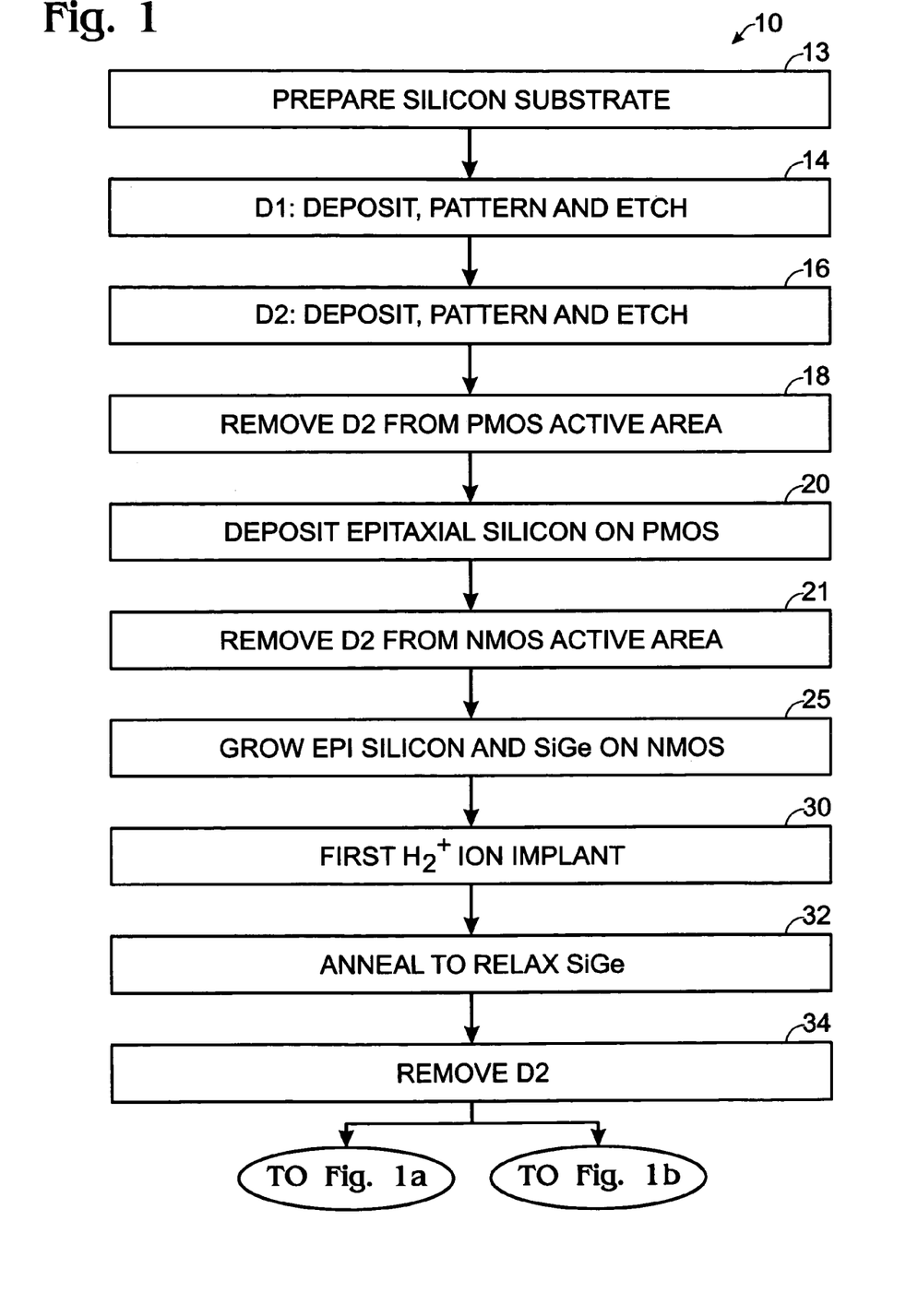
FIG. 1 is a block diagram of the method of the invention.
Figure 1A:
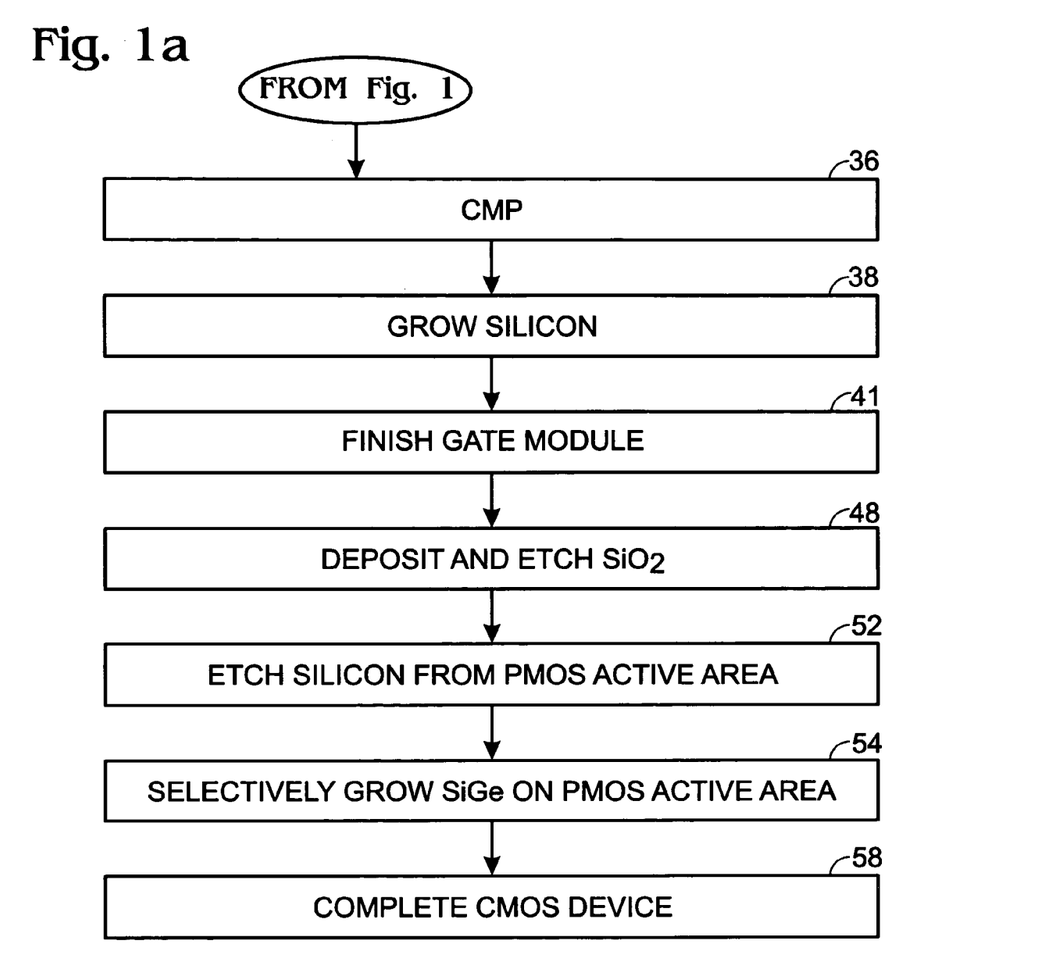
Figure 1B:
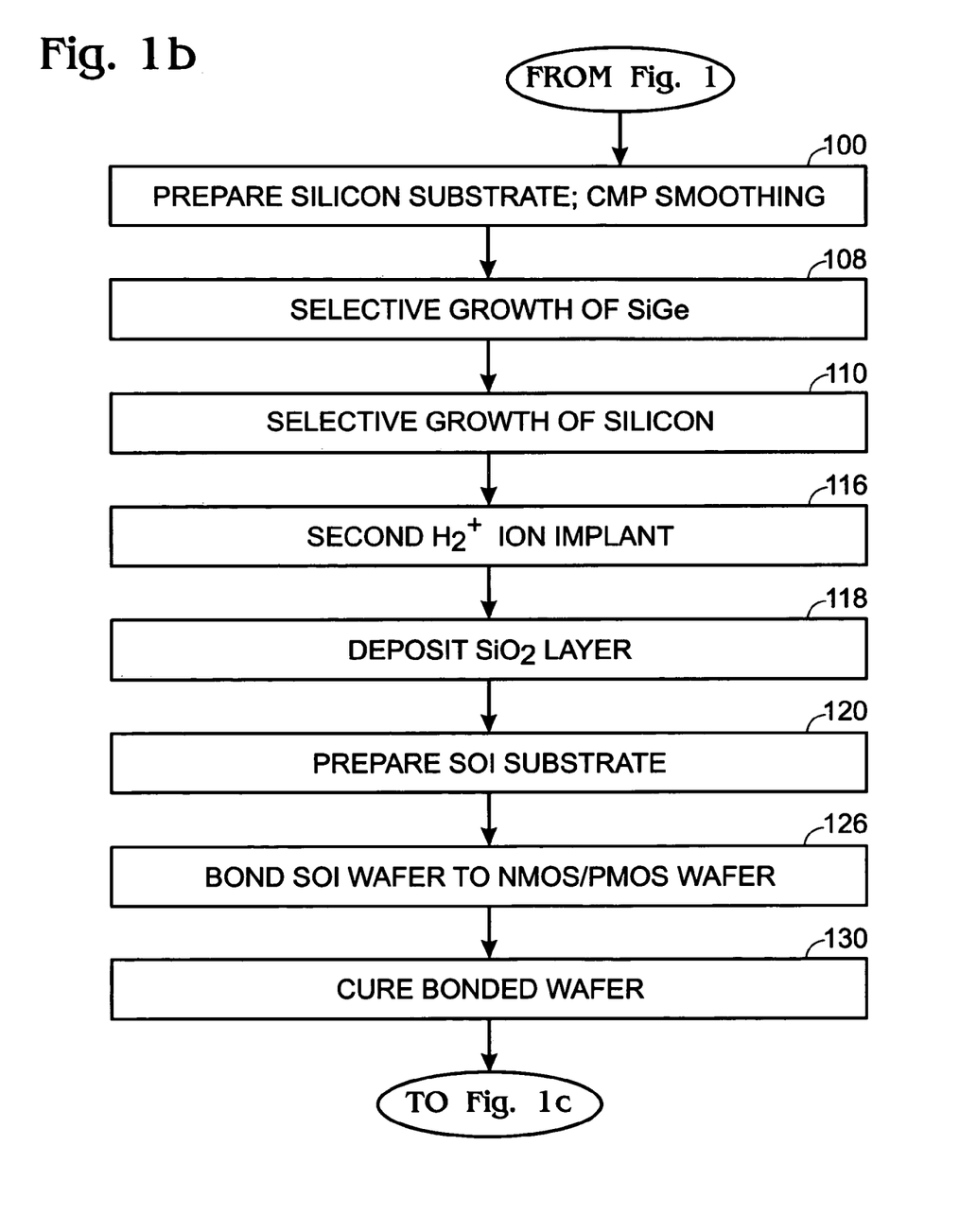
Figure 1C:
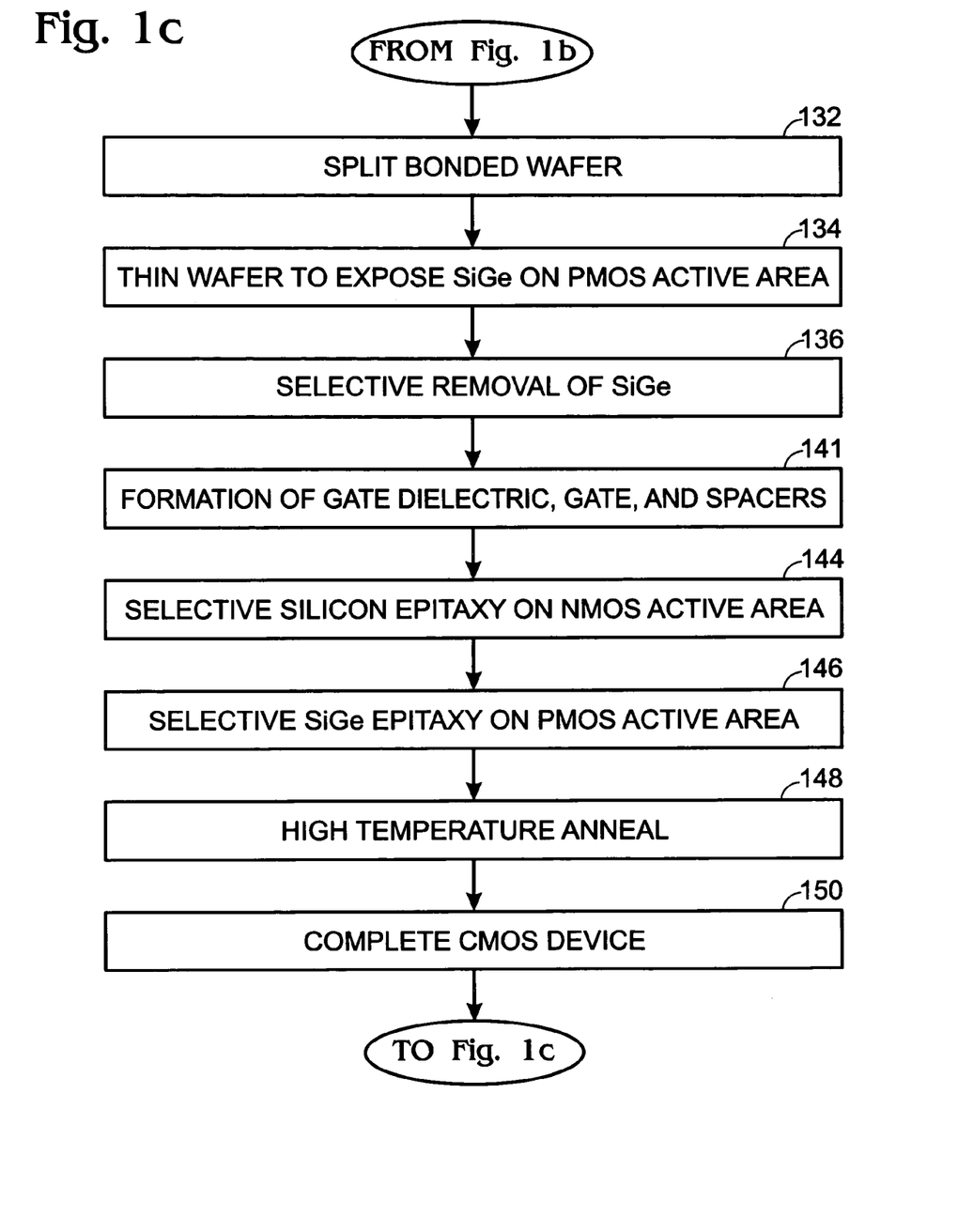

The method of the invention, depicted generally at 10 in FIG. 1, describes use of biaxial tensile strained silicon film for NMOS fabrication and uniaxial compressive strained silicon channel for PMOS fabrication on a single wafer. The wafer may be a bulk silicon wafer or may be a silicon-on-insulator (SOI) wafer.

Figure 2:
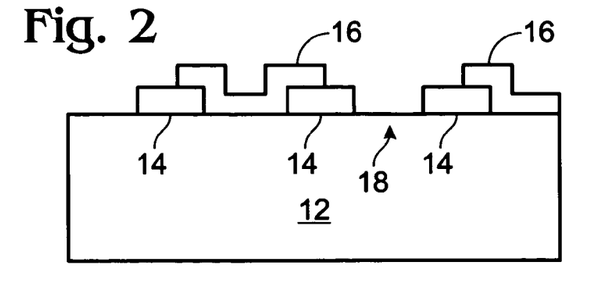
FIGS. 2–10 depict steps in the fabrication of a CMOS device according to the method of the invention on a silicon substrate.

Referring initially to FIGS. 1 and 2, a silicon substrate 12 is prepared 13 and a first insulation, or dielectric layer, (D1) 14 is deposited, patterned and etched, stopping at silicon substrate 12. D1 may be $Si_3N_4$ or $SiO_2$, and the thickness is in the range of between about 0.2 μm to 0.5 μm. The D1 pattern defines the active area isolating what will become the NMOS and PMOS active areas.

A second insulating, or dielectric, (D2) layer 16 is deposited. While D2 may be $Si_3N_4$ or $SiO_2$, it is not the same material as D1, and has a thickness in the range of between about 0.05 μm to 1 μm. D2 is patterned and etched, 16, stopping at the level of D1 14 and silicon substrate 12, to open the PMOS active area, 18.

Figure 3:
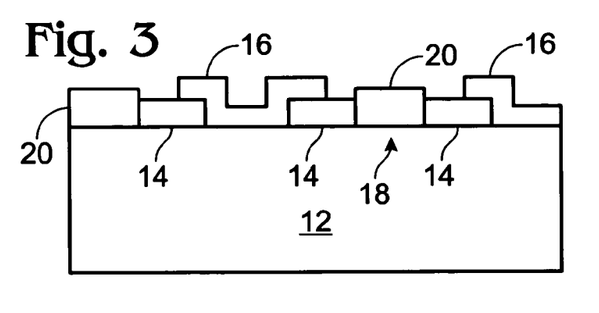

Referring to FIGS. 1 and 3, a layer of epitaxial silicon 20 is selectively grown on PMOS active area 18. Epi-silicon layer 20 has a thickness which is between about 10 nm to 100 nm thicker than that of D1.

Figure 4:
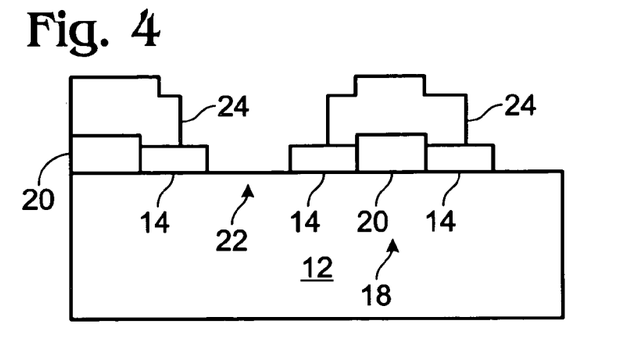

As shown in FIGS. 1 and 4, that portion of D2 covering an NMOS active area 22 is selectively removed 21, as by wet or dry etch techniques. An additional layer of D2, 24, having a thickness of between about 0.2 μm to 0.8 μm is deposited, patterned and etched, stopping at the level of D1 and silicon substrate 12 to cover PMOS active area 20 and to open NMOS active area 22.

Figure 5:
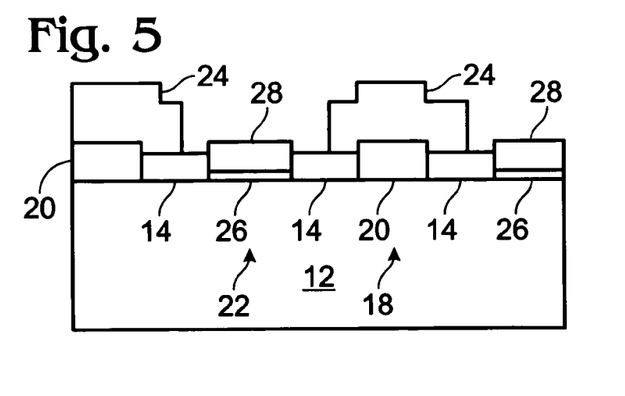

Referring now to FIGS. 1 and 5, a layer of epitaxial silicon 26 is grown 25 to a thickness of between about 100 nm to 200 nm, and a layer of SiGe 28 is grown on NMOS active area 22. The deposition temperature is kept low, e.g., 400° C. to 700° C., to prevent SiGe lattice relaxation, which relaxation would likely reduce the effectiveness of the completed device. SiGe layer 28 is under biaxial compressive strain because of a larger lattice constant than the underlying epi-silicon layer 26. Epi-silicon layer 26 plus SiGe layer 28 have a combined thickness which is 10 nm to 100 nm thicker than D1 14 thickness, and is similar in thickness to epi-silicon layer 20 in PMOS active region 18.

An alternative method for depositing SiGe is to grow relaxed SiGe by introducing defects during the SiGe growth. For example, fabricate porous silicon prior to SiGe, or grow low temperature silicon buffer prior to SiGe growth, or grow SiGe:C layer within SiGe growth. If relaxed SiGe grow in this step, SiGe relaxation by $H_2^+$ ion implantation and subsequent anneal steps can be skipped.

Figure 6:
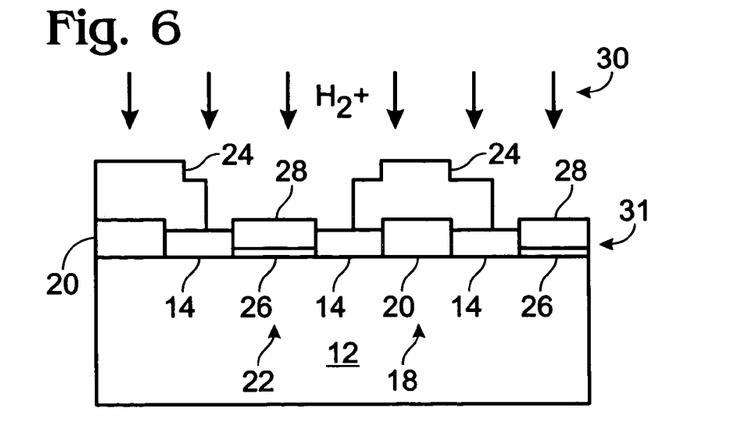

$H_2^+$ ion implantation 30 implants ions to the depths of the SiGe/epi-silicon substrate interface 31, as shown in FIG. 6. The $H_2^+$ dose is between $5 \times 10^{15}$ cm$^{-2}$ to $3 \times 10^{16}$ cm$^{-2}$ and the implantation energy is adjusted, e.g., between about 30 keV to 100 keV, to have the projected range (Rp) equal or between about 10 nm to 50 nm greater than the SiGe thickness. The structure is annealed, 32, to relax the SiGe layer. The annealing temperature is between about 600° C. to 1000° C. Defects are created at the SiGe to epi-silicon interface and the SiGe lattice is relaxed. The defects, however, do not extend into silicon substrate 12, so interwell leakage is minimized.

Figure 7:
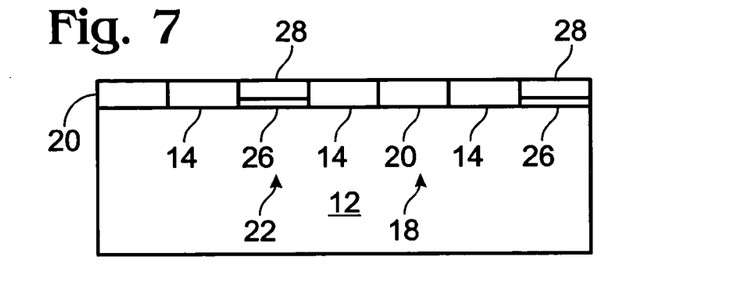

Referring to FIG. 7, layer D2 24 is removed, 34. The SiGe and silicon layers are smoothed by CMP, 36, stopping at the level of layer D1, when the SiGe and silicon epi thickness is 10 nm to 100 nm thicker than that of D1. The CMP process smooths the cross hatches on the relaxed SiGe layer and ensure that the silicon and SiGe surfaces are in the same plane.

Figure 8:
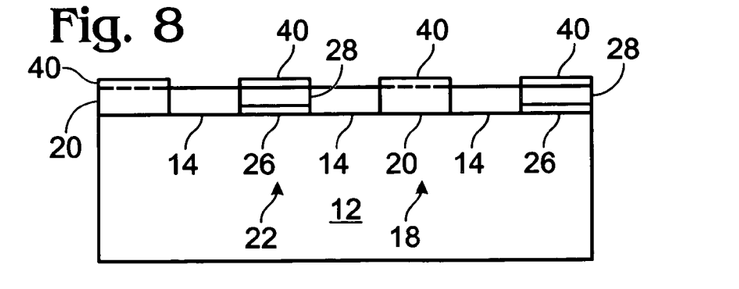

As shown in FIG. 8, selective growth 38 of a silicon layer 40 is provided, with silicon layer 40 having a thickness of between about 5 nm to 50 nm. The silicon layer in the NMOS active area is under biaxial tensile strain, whereas the silicon layer in the PMOS active area is strain free.

Figure 9:
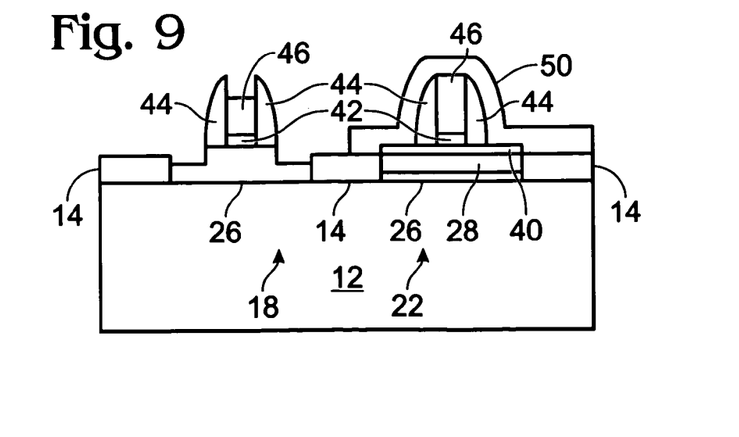

FIG. 9 depicts the structure following state of art processes to finish the gate module, 41, which includes deposition of a gate dielectric 42, deposition of gate material 46 and gate formation, and formation of sidewall spacers, 44. A layer of $SiO_2$ 50 is deposited and etched 48, so that $SiO_2$ 50 only covers the NMOS active area. The $SiO_2$ can be replaced by $Si_3N_4$ for this step to further increase the tensile strain in NMOS. The silicon layer is etched to a final thickness of between about 20 nm to 200 nm overlying the source/drain/gate on the PMOS.

Figure 10:
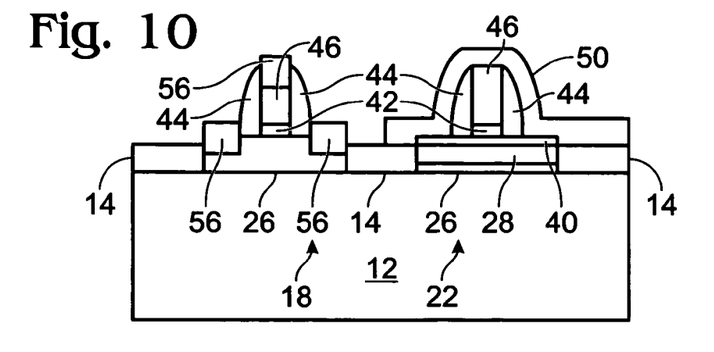

FIG. 10 depicts the nearly completed CMOS structure following selective growth 54 of epitaxial SiGe 56 on the source/drain/gate areas of PMOS. The SiGe thickness may be greater than the silicon which was removed. The germanium concentration in the SiGe layer is between about 10% to 50%. The technique to fabricate uniaxial compressive strained PMOS is taken from Thompson et al., supra. Follow the state-of-art IC process to complete the device, 58.

FIGS. 1b–1c and 11–19 depict fabrication of a CMOS device using the method of the invention, wherein the CMOS device is formed on an SOI substrate. For fabrication of the CMOS device on a SOI wafer, the steps described above are followed through the steps associated with FIG. 7, step 34 in FIG. 1, where layer D2 is removed. An alternate process step for CMOS device fabrication on SOI is to form an epitaxial SiGe layer 28, as shown in FIG. 5 and step 25, rather than to form an epitaxial silicon layer 16 and an epitaxial SiGe layer 28 as formed during fabrication of a CMOS device on a bulk silicon wafer.

Figure 11:
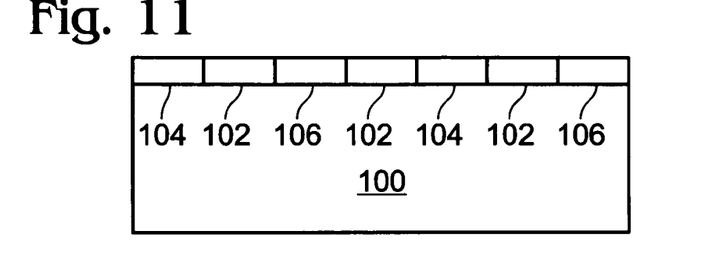
FIGS. 11–19 depict steps in the fabrication of a CMOS device according to the method of the invention on a silicon-on-insulator (SOI) substrate.

Following the above-described steps through step 34, a substrate 100 is prepared, including formation of a D1 layer 102, a silicon layer 104, and a relaxed SiGe layer 106. A D2 layer is initially formed, and then removed, as in the first embodiment of the method of the invention. The remaining structure is smoothed by CMP 100, resulting in a SiGe layer 106, and an epi-silicon layer 104 having a thickness about the same as that of D1. The CMP is to smooth the cross hatches on the relaxed SiGe surface and to insure that the silicon and SiGe surfaces are planar relative to one another.

Figure 12:
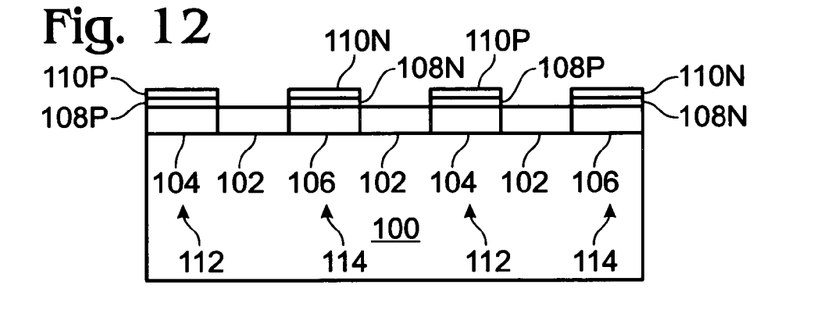

As shown in FIG. 12, a layer of SiGe 108 is selectively grown to a thickness of between about 10 nm to 50 nm, and a layer of silicon 110 is selectively grown to a thickness of between about 5 nm to 50 nm. The SiGe layer 108N on NMOS area 114 is relaxed, while silicon layer 110N is under biaxial tensile strain. In contrast, SiGe layer 108P in PMOS area 112 is under biaxial compressive strain, while silicon layer 110P is strain free.

Figure 13:
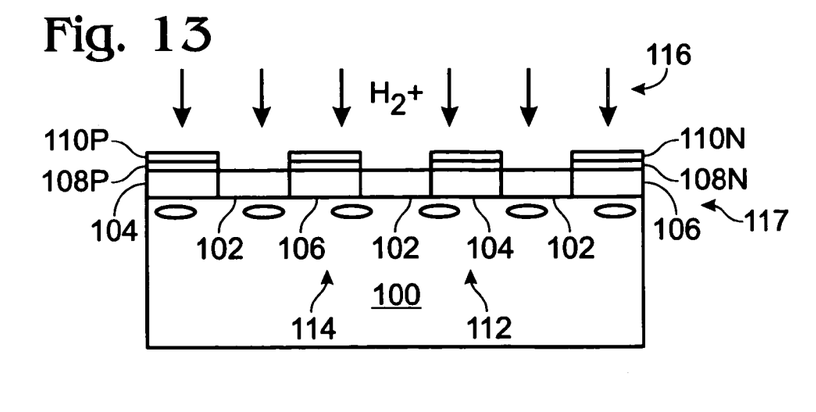
Figure 14:
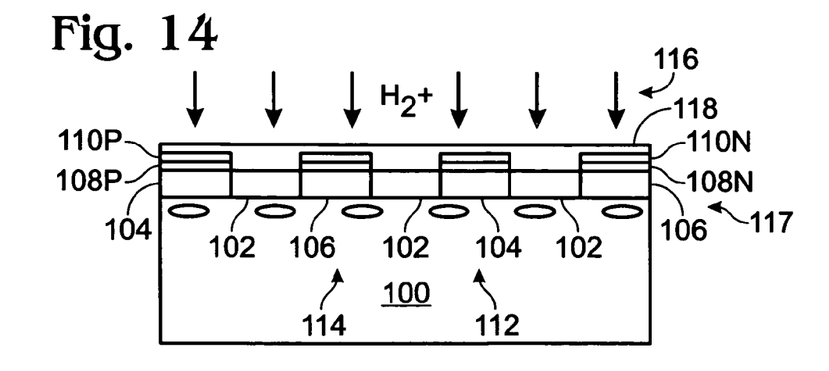

FIGS. 13 and 14 depicts two methods of $H_2^+$ ion implantation 116. In either case, the dose is between about $2 \times 10^{16}$ cm$^{-2}$ to $5 \times 10^{16}$ cm$^{-2}$, and the energy is between about 30 keV to 200 keV. $H_2^+$ II implantation creates defects, resulting in a splitting plane 117, as described in U.S. Pat. No. 6,767,802 and U.S. patent application Ser. No. 10/674,369, supra, and represented by ovals in the drawing figure.

FIG. 14 depicts the alternate ion implantation procedure. To prevent the surface roughness that may cause problems during bonding, $SiO_2$ deposition 118 and CMP planarization can be applied before the $H_2^+$ II. This is an alternative way to the previous figure and related processes.

Figure 15:
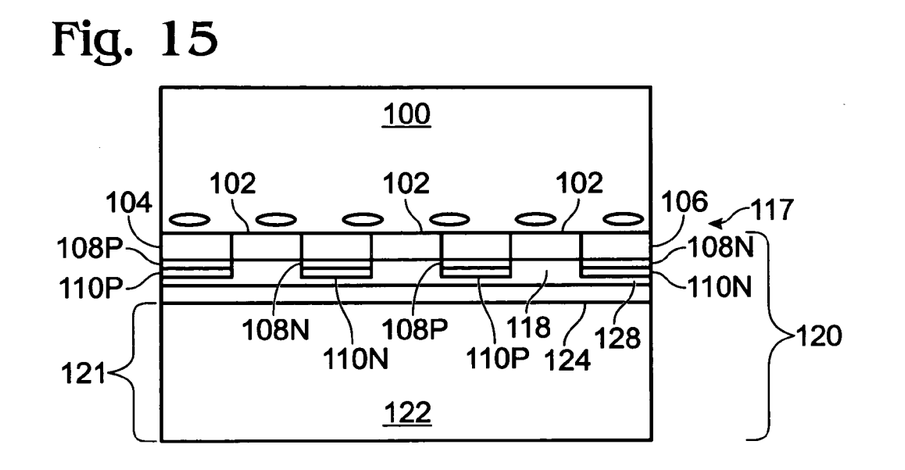

Referring to FIG. 15, a silicon-on-insulator (SOI) wafer 120 is prepared. SOI wafer preparation includes bonding two wafers together, wherein one wafer is referred to herein as a handle wafer 121, which includes a bulk silicon layer substrate 122 and a thin $SiO_2$ layer, and wherein the other wafer is referred to herein as a donor wafer 100, and is prepared as described above. $SiO_2$ portion 124 of handle wafer 121 has a thickness of between about zero nm to 1000 nm. Donar wafer 100 is prepared in accordance with wafer preparation described to and including step 116 in FIGS. 1, 13 and 14. Both handle wafer 121 and donar wafer 100 are chemically treated, including dipping in $NH_4OH+H_2O_2+H_2O$, dipping in $H_2SO_4+H_2O_2+H_2O$, or $O_2$ plasma treatment. A bonding process 126 occurs when the two wafers are brought in close proximity to one another. If no $SiO_2$ deposition and CMP planarization is performed prior to the $H_2^+$ ion implantation, the bonding interface 128 is $SiO_2$ to silicon. When $SiO_2$ deposition and CMP planarization is performed prior to the $H_2^+$ ion implantation, the bonding interface 128 is $SiO_2$ to $SiO_2$. The bonded wafer pair is cured 130 in an ambient atmosphere at between about 200° C. to 250° C. for between about 5 hours to 24 hours.

Figure 16:
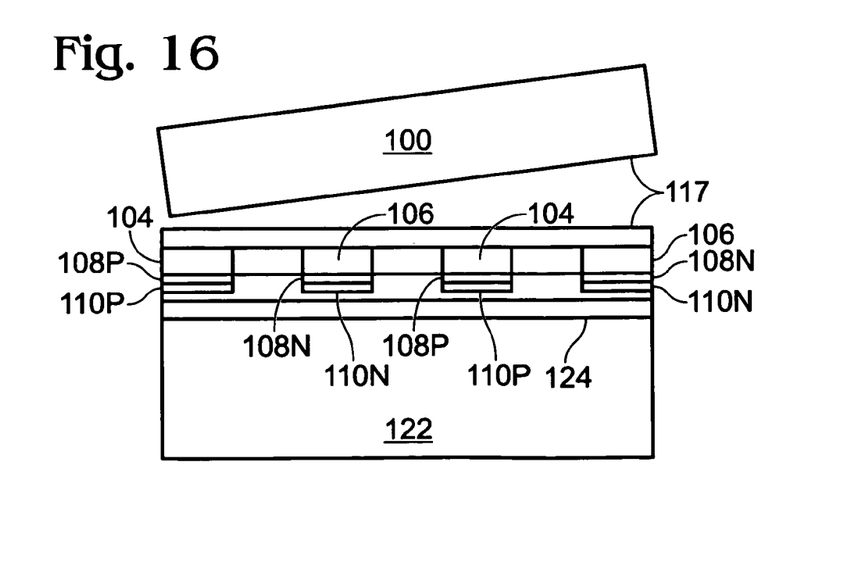

The bonded wafer is split 132 along splitting plane 117 in furnace at temperature of between about 350° C. to 500° C. for between about 0.5 hour to 5 hours, as depicted in FIG. 16. SOI wafer 120 includes a silicon layer 101, which was the original surface layer of donar wafer 100.

Figure 17:
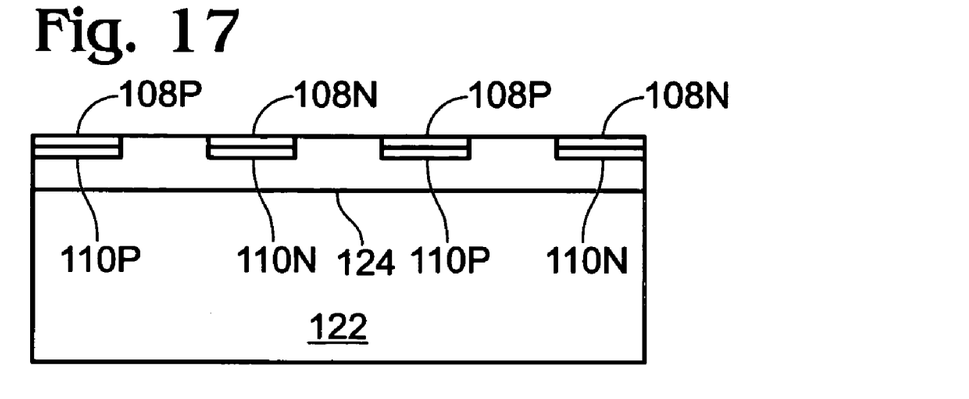

As shown in FIG. 17, the SOI wafer 120, having silicon layer 110 and a SiGe layer 108 thereon, is thinned 134 until SiGe layer 108P is exposed on the PMOS area. The thinning process may be a combination of dry etch and CMP, or CMP alone. The CMP is necessary to smooth the rough splitting plane.

Figure 18:
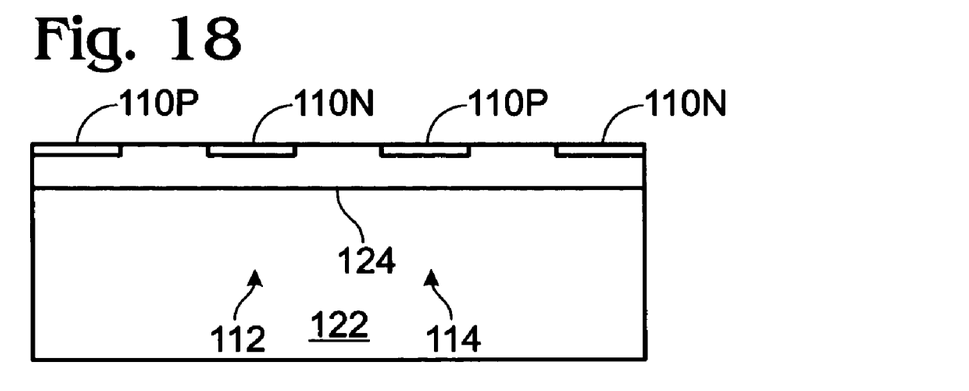

SiGe layer 108 is selectively removed 136 to expose silicon layer 110, FIG. 18. The selective etch may use wet chemical etch ($NH_4OH+H_2O_2+H_2O$) or dry etch ($CF_4+O_2$).

Figure 19:
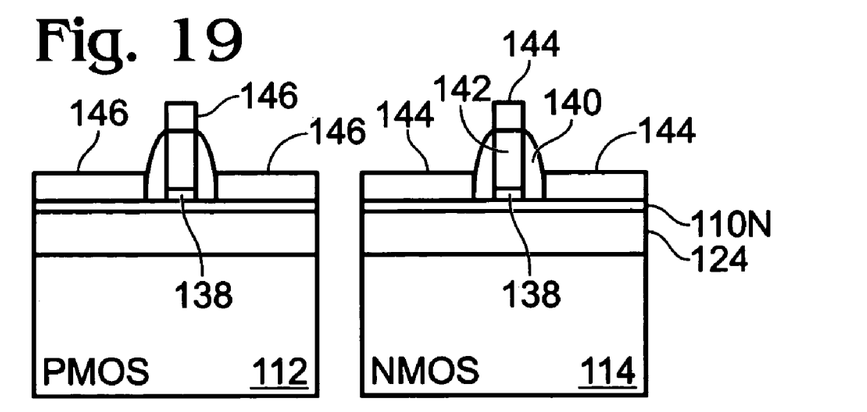

Referring now to FIG. 19, silicon layer 110N on the NMOS active area is biaxial tensile strained, whereas on the PMOS active area, the silicon layer 110P is strain free. State-of-the-art processes 141 are followed to finish the gate dielectric 138, gate formation 142, and spacer formation 140. The raised source/drain process is necessary in the SOI device to reduce the series resistance. For NMOS 114, selective silicon epitaxy 144 on source/drain/gate is performed. The biaxial tensile strain in the channel is preserved. For PMOS 112, selective SiGe epitaxy 146 on source/drain/gate is performed. A high temperature anneal 148 may be applied so that SiGe will react with the silicon seed layer in the source/drain area. Because the SiGe has larger lattice constant, the PMOS channel is under uniaxial compressive strain along the source to drain direction. The CMOS device is then completed, 150.

Again, alternate embodiments may include biaxial tensile strained NMOS and uniaxial compressive strained PMOS on same SOI wafer, and process integration on how to make these two devices on the same wafer.

Thus, a method for fabrication of a tensile strained layer and a compression strained layer on a single wafer for use in CMOS ICs has been disclosed. It will be appreciated that further variations and modifications thereof may be made within the scope of the invention as defined in the appended claims.

We claim:

1. A method of fabricating a biaxial tensile strained layer for NMOS fabrication and a uniaxial compression strained layer for PMOS fabrication on a single wafer for use in CMOS ICs, comprising:
   preparing a wafer, including preparing a silicon substrate for a CMOS device fabrication;
   depositing, patterning and etching a first insulating layer on the silicon substrate;
   depositing, patterning and etching a second insulating layer on the first insulating layer;
   removing a portion of the second insulating layer from a PMOS active area;
   depositing a layer of epitaxial silicon on the PMOS active area;
   removing a portion of the second insulating layer from an NMOS active area;
   growing an epitaxial silicon layer and growing an epitaxial SiGe layer on the NMOS active area;
   implanting $H_2^+$ ions;
   annealing the wafer to relax the SiGe layer;
   removing the remaining second insulating layer;
   smoothing the wafer by CMP;
   growing a layer of silicon;
   finishing a gate module;
   depositing a layer of $SiO_2$ over the NMOS active area;
   etching silicon in the PMOS active area;
   selectively growing a SiGe layer on the PMOS active area; wherein the silicon layer in the NMOS active area is under biaxial tensile strain, and the silicon layer in the PMOS active area is uniaxial compression strained; and
   completing the CMOS device.

2. The method of claim 1 wherein a first insulating layer is taken from the group of dielectric materials consisting of $Si_3N_4$ and $SiO_2$, and wherein a second insulating layer is taken from the group of dielectric materials consisting of $SiO_2$ and $Si_3N_4$, and wherein the first insulating layer material is different than the second insulating layer material.

3. The method of claim 1 wherein said growing an epitaxial silicon layer and growing an epitaxial SiGe layer on the NMOS active area includes growing the SiGe layer at a temperature of between about 400° C. to 700° C. to prevent relaxation of the SiGe lattice.

4. The method of claim 3 wherein said growing an epitaxial silicon layer and growing an epitaxial SiGe layer on the NMOS active area includes growing the epitaxial silicon layer and the epitaxial SiGe layer to a combined thickness which is 10 nm to 100 nm thicker than the thickness of the first insulating layer.

5. The method of claim 1 wherein said growing an epitaxial silicon layer and growing an epitaxial SiGe layer on the NMOS active area includes growing the epitaxial SiGe layer with a larger lattice constant than that of the underlying epitaxial silicon layer, resulting in the epitaxial SiGe under biaxial compressive strain.

6. The method of claim 1 where said implanting $H_2^+$ ions includes implanting $H_2^+$ ions at a dose of between about $5\times10^{15}$ cm$^{-2}$ to $3\times10^{16}$ cm$^{-2}$ and at an implantation energy of between about 30 keV to 100 keV, to have a projected ion penetration range (Rp) equal or between about 10 nm to 50 nm greater than the SiGe thickness.

7. A method of fabricating a biaxial tensile strained layer for NMOS fabrication and a uniaxial compression strained layer for PMOS fabrication on a silicon-on-insulator (SOI) wafer for use in CMOS ICs, comprising:
   preparing a silicon substrate as a donor wafer for SOI fabrication;
   depositing, patterning and etching a first insulating layer;
   depositing, patterning and etching a second insulating layer;
   removing a portion of the second insulating layer from a PMOS active area;
   depositing a layer of epitaxial silicon on the PMOS active area;
   removing a portion of the second insulating layer from an NMOS active area;
   growing an epitaxial SiGe layer on the NMOS active area;
   implanting $H_2^+$ ions;
   annealing the donor wafer to relax the SiGe layer;
   removing the remaining second insulating layer from the CMOS wafer;
   smoothing the donor wafer by CMP;
   selectively growing a layer of SiGe;
   selectively growing a layer of silicon;
   implanting a second dose of $H_2^+$ ions;
   preparing a silicon handle wafer;
   growing a layer of $SiO_2$ on the silicon handle wafer;
   bonding the donor wafer to the silicon handle wafer to form a bonded pair;
   curing the bonded pair;

splitting the bonded pair, thereby transferring a surface layer of the donar wafer to the silicon handle wafer;
thinning the transferred surface layer to expose the SiGe layer;
selectively removing SiGe;
forming a gate dielectric, a gate and spacers;
selectively growing an epitaxial SiGe layer on a PMOS source, a PMOS drain and PMOS gate;
selectively growing an epitaxial silicon layer on a NMOS source, a NMOS drain and NMOS gate;
annealing the NMOS/PMOS portion;
wherein the silicon layer in the NMOS active area is under biaxial tensile strain, and the silicon layer in the PMOS active area is uniaxial compression strained; and
completing the CMOS device.

8. The method of claim 7 wherein a first insulating layer is taken from the group of dielectric materials consisting of $Si_3N_4$ and $SiO_2$, and wherein a second insulating layer is taken from the group of dielectric materials consisting of $SiO_2$ and $Si_3N_4$, and wherein the first insulating layer material is different than the second insulating layer material.

9. The method of claim 7 wherein said growing an epitaxial SiGe layer on the NMOS active area includes growing the SiGe layer at a temperature of between about 400° C. to 700° C. to prevent relaxation of the SiGe lattice.

10. The method of claim 9 wherein said growing an epitaxial SiGe layer on the NMOS active area which is 10 nm to 100 nm thicker than the thickness of the first insulating layer.

11. The method of claim 7 wherein said growing an epitaxial SiGe layer with a larger lattice constant than that of the underlying silicon substrate, resulting in the epitaxial SiGe under biaxial compressive strain.

12. The method of claim 7 where said implanting $H_2^+$ ions includes implanting $H_2^+$ ions at a dose of between about $5 \times 10^{15}$ cm$^{-2}$ to $3 \times 10^{16}$ cm$^{-2}$ and at an implantation energy of between about 30 keV to 100 keV, to have a projected ion penetration range (Rp) equal or between about 10 nm to 50 nm greater than the SiGe thickness.

* * * * *